(12) United States Patent
Pulijala et al.

(10) Patent No.: US 9,985,589 B2
(45) Date of Patent: May 29, 2018

(54) SYSTEM AND METHOD FOR IMPROVING TOTAL HARMONIC DISTORTION OF AN AMPLIFIER

(71) Applicant: TEXAS INSTRUMENTS INCORPORATED, Dallas, TX (US)

(72) Inventors: Srinivas K. Pulijala, Tucson, AZ (US); Steven G. Brantley, Satellite Beach, FL (US); Bharath K. Vasan, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 0 days. days.

(21) Appl. No.: 15/242,203

(22) Filed: Aug. 19, 2016

(65) Prior Publication Data
US 2017/0054417 A1    Feb. 23, 2017

Related U.S. Application Data

(60) Provisional application No. 62/208,360, filed on Aug. 21, 2015.

(51) Int. Cl.
| | |
|---|---|
| *H03F 3/45* | (2006.01) |
| *H03F 1/32* | (2006.01) |
| *H03F 3/26* | (2006.01) |
| *G05F 1/56* | (2006.01) |

(52) U.S. Cl.
CPC ............ *H03F 1/3211* (2013.01); *G05F 1/561* (2013.01); *H03F 3/26* (2013.01); *H03F 3/45139* (2013.01); *H03F 3/45* (2013.01); *H03F 3/45085* (2013.01); *H03F 3/45183* (2013.01); *H03F 2200/69* (2013.01); *H03F 2203/45134* (2013.01); *H03F 2203/45288* (2013.01); *H03F 2203/45392* (2013.01); *H03F 2203/45722* (2013.01)

(58) Field of Classification Search
CPC .................................................... H03F 1/3211
USPC .................................. 330/252–261, 310, 311
See application file for complete search history.

(56) References Cited

U.S. PATENT DOCUMENTS

| | | | | |
|---|---|---|---|---|
| 3,927,333 A | * | 12/1975 | Furuhashi | H03F 3/26 327/423 |
| 8,692,615 B2 | * | 4/2014 | Herrera | H03F 1/3211 330/124 R |

* cited by examiner

*Primary Examiner* — Khanh V Nguyen
*Assistant Examiner* — Khiem Nguyen
(74) *Attorney, Agent, or Firm* — William B. Kempler; Charles A. Brill; Frank D. Cimino

(57) ABSTRACT

A voltage-to-current converter includes a first differential pair of transistors, a second differential pair of transistors, and a first resistor. The first differential pair of transistors includes a first transistor and a second transistor. An emitter of the first transistor is directly connected to an emitter of the second transistor. The second differential pair of transistors includes a third transistor and a fourth transistor. An emitter of the third transistor is directly connected to an emitter of the fourth transistor. The first resistor is connected to the emitter of the first transistor, the emitter of the second transistor, the emitter of the third transistor, and the emitter of the fourth transistor.

14 Claims, 2 Drawing Sheets

SYSTEM AND METHOD FOR IMPROVING TOTAL HARMONIC DISTORTION OF AN AMPLIFIER

CROSS-REFERENCE TO RELATED APPLICATIONS

The present application claims priority to U.S. Provisional Patent Application No. 62/208,360, filed Aug. 21, 2015, titled "Method For Improving THD Of An Amplifier," which is hereby incorporated herein by reference in its entirety.

BACKGROUND

Voltage-to-current converters, such as transconductance amplifiers, may be utilized in a variety of electrical circuits including operational amplifiers, other multi-stage amplifiers, and/or any other high gain circuit. These voltage-to-current converters are configured to receive an input voltage and generate an output current. In order to achieve low total harmonic distortion (i.e., to linearize the relationship between the input voltage and the output current), conventional voltage-to-current converters may utilize emitter degeneration, concave compensation, and/or a multi-tan h differential pair of transistors.

SUMMARY

The problems noted above are solved in large part by systems and methods of reducing total harmonic distortion of an amplifier. In some embodiments, a voltage-to-current converter includes a first differential pair of transistors, a second differential pair of transistors, and a first resistor. The first differential pair of transistors includes a first transistor and a second transistor. An emitter of the first transistor is directly connected to an emitter of the second transistor. The second differential pair of transistors includes a third transistor and a fourth transistor. An emitter of the third transistor is directly connected to an emitter of the fourth transistor. The first resistor is connected to the emitter of the first transistor, the emitter of the second transistor, the emitter of the third transistor, and the emitter of the fourth transistor.

Another illustrative embodiment is an operational amplifier that includes a stage circuit and an output stage circuit. The stage circuit includes a voltage-to-current converter configured to receive a differential voltage input signal and generate a current output signal. The stage circuit includes a first differential pair of transistors that includes a first transistor and a second transistor. The stage circuit also includes a second differential pair of transistors that includes a third transistor and a fourth transistor. The stage circuit also includes a linearization resistor. The emitter of the first transistor is directly connected to an emitter of the second transistor, an emitter of the third transistor is directly connected to an emitter of the fourth transistor, and the linearization resistor is connected to the emitter of the first transistor, the emitter of the second transistor, the emitter of the third transistor, and the emitter of the fourth transistor.

Yet another illustrative embodiment is a voltage-to-current converter that includes a first differential pair of transistors, a second differential pair of transistors, and a linearization resistor. Emitters of the first differential pair of transistors are directly connected to each other and to a linearization resistor. Emitters of the second differential pair of transistors are directly connected to each other and to the linearization transistor.

BRIEF DESCRIPTION OF THE DRAWINGS

For a detailed description of various examples, reference will now be made to the accompanying drawings in which.

NOTATION AND NOMENCLATURE

Figure 1:
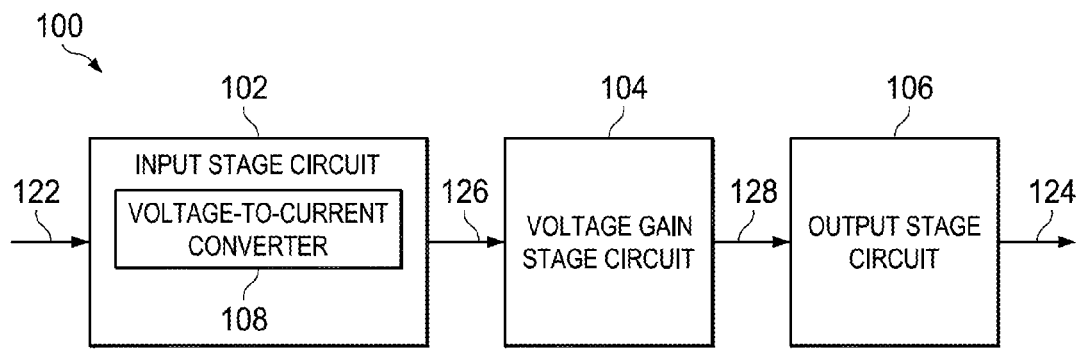
FIG. 1 shows an illustrative block diagram of an operational amplifier in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad applications, and the discussion of any embodiment is meant only to be exemplary of that embodiment, and not intended to intimate that the scope of the disclosure, including the claims, is limited to that embodiment.

Voltage-to-current converters are configured to receive an input voltage and generate an output current. Ideally, there is no harmonic distortion in the current output signal (i.e., the relationship between the input voltage and the output current is linear). However, in conventional voltage-to-current converters, the relationship between the input voltage and the output current is weakly non-linear. In order to increase the linearity between the input voltage and the output current (i.e., to reduce the total harmonic distortion), conventional systems may utilize emitter degeneration, concave compensation, and/or a multi-tan h differential pair of transistors.

Conventional voltage-to-current converters may include a linearization resistor to attempt to linearize transconductance at high output currents to reduce harmonic distortion. These conventional voltage-to-current converters include two differential pairs of transistors with the linearization resistor connecting the pairs. More particularly, the conventional voltage-to-current converter includes two differential pair of transistors with a linearization transistor connecting the emitters of the two transistors in each of the differential pairs. In other words, the emitters of the two transistors in the differential pair are connected, but not directly connected. Instead, they are connected through the linearization resistor. In this configuration, in order to increase the linearity of the system, the value of the linearization resistor must be greater than $$\frac{1}{GM},$$

where GM is the transconductance of the transistor. To obtain higher overall transconductance, the linearization resistor value is decreased and GM of the transistor increased while keeping the same aforementioned relationship. This adversely affects linearity as the transfer function has a "cross-over behavior". To minimize this cross-over requires large power consumption.

In accordance with the disclosed principles, a voltage-to-current converter includes a linearization resistor that connects two differential pairs of transistors. However, unlike in the conventional system, the emitters of the two transistors that make up each of the differential pair of transistors are directly connected to one another. The linearization resistor then connects the emitters of one differential pair of transistors to the other differential pair of transistors. Additionally, in some embodiments, the linearization transistor is included in a translinear loop of resistors to reduce power consumption. In this configuration, the transconductance in the circuit and the linearization resistor may be, unlike in the conventional voltage-to-current converter, independently configured (i.e., set) to improve overall linearity of the relationship between the input voltage and the output current and, thus, reduce the total harmonic distortion of the voltage-to-current converter. Furthermore, power consumption is significantly decreased due to the voltage drop across the resistors in the translinear loop.

FIG. 1 shows an illustrative block diagram of an operational amplifier 100 in accordance with various embodiments. The operational amplifier 100 may include an input stage circuit 102, a voltage gain circuit 104, and an output stage circuit 106. The input stage circuit 102 is electric circuit configured to receive a voltage input signal 122. In some embodiments, voltage input signal 122 is a differential voltage. In other words, the voltage input signal 122 may be a pair of the same voltage signal, except that the differential pair of signals are 180 degrees out of phase with each other. Thus, the amplitude of the two signals that make up the differential voltage is the same; however, the phase of the two signals is different.

Input stage circuit 102 may include voltage-to-current converter 108. While shown in the input stage circuit 102 in FIG. 1, in other embodiments, the voltage-to-current converter 108 may be located in any stage of the operational amplifier 100 including the input stage circuit 102, the voltage gain stage circuit 104, and/or the output stage circuit 106. Furthermore, in some embodiments, the voltage-to-current converter 108, in addition to being utilized in the operational amplifier 100 as shown in FIG. 1, may be utilized in any type of high gain circuit or any other electrical system. For example, voltage-to-current converter 108 may be utilized in any type of multi-stage amplifier. In some embodiments, the voltage-to-current converter 108 is a BJT Class AB transconductance amplifier. In alternative embodiments, the voltage-to-current converter 108 is any other type of transconductance amplifier. In other words, the voltage-to-current converter 108 may be any electrical circuit configured to receive an input voltage and generate an output current. The voltage-to-current converter 108 includes two differential transistor pairs. One of the differential transistor pairs includes two matched negative-positive-negative (NPN) bipolar junction transistors (BJTs). In some embodiments, this differential transistor pair acts to provide a high input impedance. The second differential transistor pair includes two matched positive-negative-positive (PNP) BJTs. The two differential transistor pairs are connected to one another via a linearization resistor which acts to linearize the transconductance for a small input signal 122 and for a large input signal 122. The voltage-to-current converter generates current output signal 126. In some embodiments, current output signal 126 is a differential current. In other words, the current output signal 122 may be a pair of the same voltage signal, except that the differential pair of signals are 180 degrees out of phase with each other. Thus, the amplitude of the two signals that make up the differential current is the same; however, the phase of the two signals is different.

The voltage gain stage circuit 104 is an electric circuit configured to receive the current output signal 126 and to generate gained voltage output signal 128 (a signal with a voltage gain with respect to voltage input signal 122). Thus, the current output signal 126 drives voltage gain stage circuit 104. In some embodiments, the voltage gain stage circuit 104 includes two NPN BJTs connected such that the emitter of the first BJT is directly connected to the base of the second BJT. The collector of the first BJT is directly connected to the collector of the second BJT. In this configuration, the voltage gain stage circuit 104 acts to provide a high voltage gain to the voltage input signal 122. In alternative embodiments, the voltage gain stage circuit 104 may consist of any combination of transistors that act to generate a voltage gain on the voltage input signal 122 by generating gained voltage output signal 128.

The output stage circuit 106 is an electric circuit configured to receive the gained voltage output signal 128 and to generate the amplifier output signal 124. In some embodiments, output stage circuit 106 comprises a Class AB push-pull emitter follower amplifier. However, in other embodiments other circuits may be utilized to generate the amplifier output signal 124. The amplifier output signal 124 may be an amplified version of the voltage input signal 122.

Figure 2:
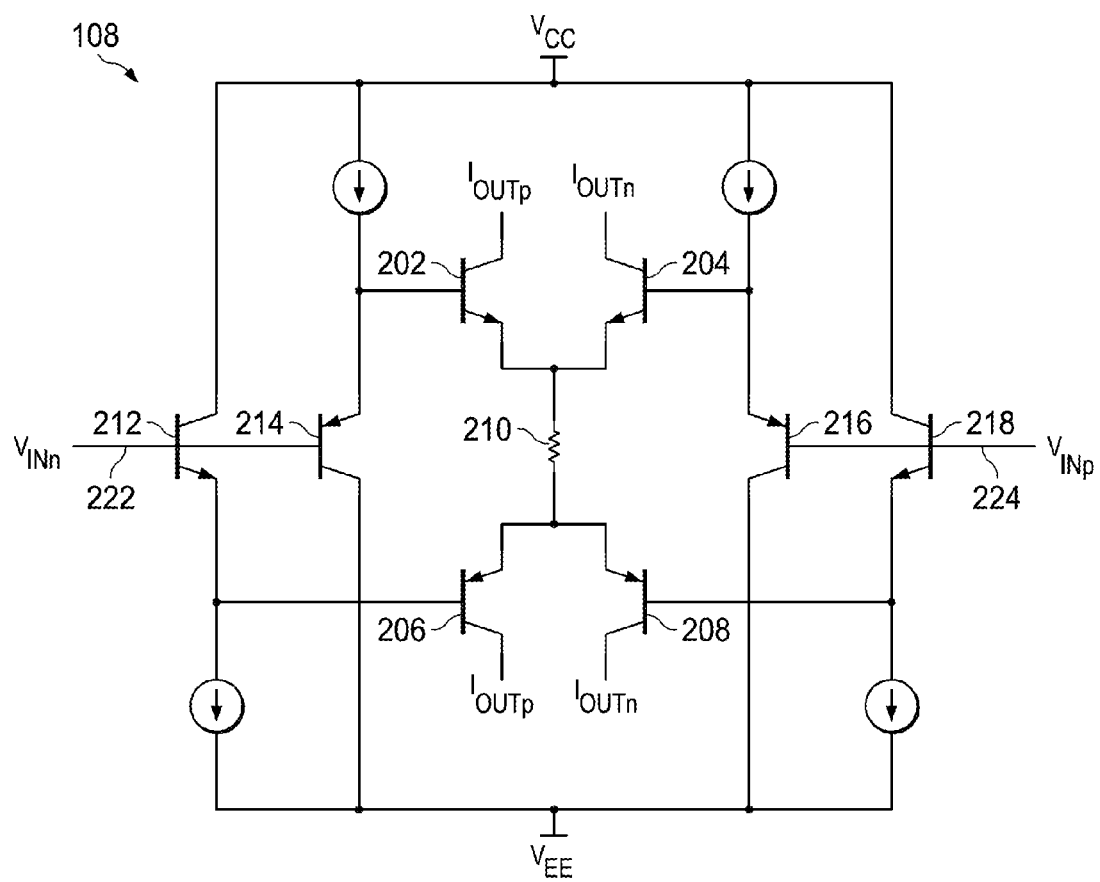
FIG. 2 shows an illustrative circuit diagram of a voltage-to-current converter in accordance with various embodiments.

FIG. 2 shows an illustrative circuit diagram of voltage-to-current converter 108 in accordance with various embodiments. Voltage-to-current converter 108 may include a first differential pair of transistors that includes transistors 202-204, which in some embodiments are NPN BJTs, and a second differential pair of transistors that includes transistors 206-208, which in some embodiments are PNP BJTs. Linearization resistor 210 couples the first differential pair of transistors to the second differential pair of transistors. More particularly, the emitters of the two transistors 202-204 that make up the first differential pair of transistors are directly connected to the linearization resistor 210. Additionally, the emitters of the two transistors 202-204 that make up the first differential pair of transistors are directly connected to one another. In other words, the emitter of transistor 202 is directly connected to the emitter of transistor 204 (i.e., there is a direct connection without any resistor between the emitters of transistors 202-204 of the first differential pair of transistors) and to the linearization resistor 210. Furthermore, the emitter of transistor 204 is directly connected to the linearization resistor 210 as well.

Similarly, the emitters of the two transistors 206-208 that make up the second differential pair of transistors are directly connected to the linearization resistor 210. Additionally, the emitters of the two transistors 206-208 that make up the second differential pair of transistors are directly connected to one another. In other words, the emitter of transistor 206 is directly connected to the emitter of transistor 208 (i.e., there is a direct connection without any resistor between the emitters of transistors 206-208 of the second differential pair of transistors) and to the linearization resistor 210. Furthermore, the emitter of transistor 208 is directly connected to the linearization resistor 210 as well.

The voltage-to-current converter 108 may also include transistors 212-218. In some embodiments, the transistors 212 and 218 are NPN BJTs while transistors 214 and 216 are PNP BJTs. The base of transistor 202 is connected to the emitter of transistor 214 and the base of transistor 204 is connected to the emitter of transistor 216. Similarly, the base of transistor 206 is connected to the emitter of transistor 212 and the base of transistor 208 is connected to the emitter of transistor 218. The base of transistors 212 and 214 may receive voltage input signal 222. The base of transistors 216 and 218 may receive the voltage input signal 224. The voltage input signals 222 and 224 may comprise the differential voltage input signal 122 from FIG. 1. More particularly, the voltage input signal 222 may be a negative voltage input signal ($V_{INn}$) while the voltage input signal 224 may be a positive voltage input signal ($V_{INp}$). The collector of transistors 212 and 218 may be directly connected to the collector power supply line voltage $V_{CC}$ and the collectors of transistors 214 and 216 may be directly connected to the emitter power supply line voltage $V_{EE}$. The collectors of transistors 202-208 may generate, and thus are directly connected to, the current output signal 126. More particularly, the collectors of transistors 204 and 208 are connected to a negative current output signal ($I_{OUTn}$) while the collectors of transistors 202-206 are connected to a positive current output signal ($I_{OUTp}$).

This configuration creates less (i.e., better) total harmonic distortion in the voltage-to-current converter 108 than in conventional voltage-to-current converters. For example, in the configuration of voltage-to-current converter 108, for small signals, $I_{OUTp}-I_{OUTn}=GM \times (V_{INn}-V_{INp})$ and for large signals, $$I_{OUTp} - I_{OUTn} \approx \frac{1}{R_{210}} \times (V_{INn} - V_{INp})$$

where GM is the transconductance and $R_{210}$ is the resistance of the linearization resistor 210. Thus, for both large and small signals GM is independent of $R_{210}$. Thus, GM and $R_{210}$ may be independently configured (i.e., set) to improve overall linearity of the relationship between the voltage input signal 122 and the current output signal 126 and, thus, reduce the total harmonic distortion of the voltage-to-current converter 108.

Figure 3:
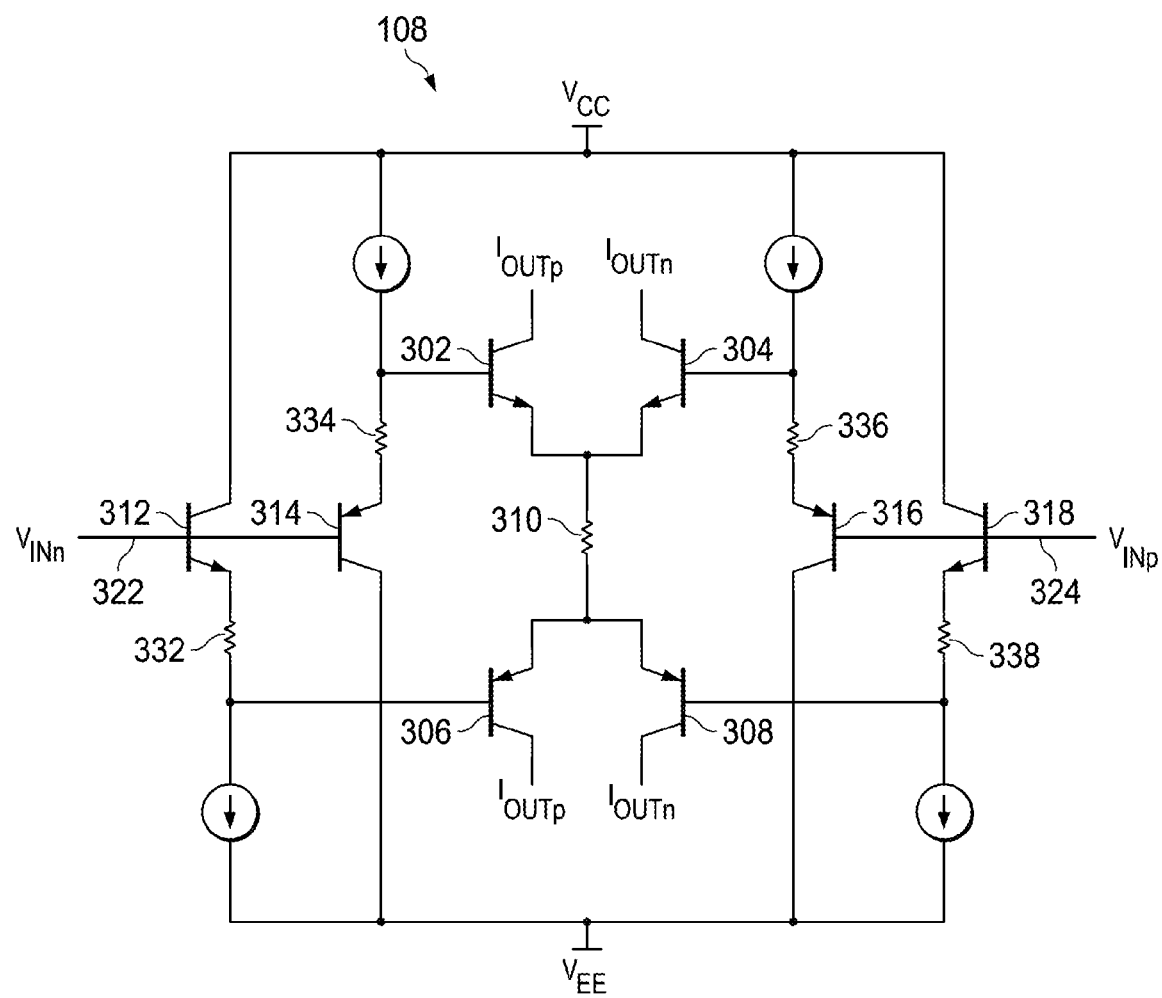
FIG. 3 shows an illustrative circuit diagram of a voltage-to-current converter in accordance with various embodiments.

FIG. 3 shows an illustrative circuit diagram of voltage-to-current converter 108 in accordance with various embodiments. Voltage-to-current converter 108 may include a first differential pair of transistors that includes transistors 302-304, which in some embodiments are NPN BJTs, and a second differential pair of transistors that includes transistors 306-308, which in some embodiments are PNP BJTs. Linearization resistor 310 couples the first differential pair of transistors to the second differential pair of transistors. More particularly, the emitters of the two transistors 302-304 that make up the first differential pair of transistors are directly connected to the linearization resistor 310. Additionally, the emitters of the two transistors 302-304 that make up the first differential pair of transistors are directly connected to one another. In other words, the emitter of transistor 302 is directly connected to the emitter of transistor 304 (i.e., there is a direct connection without any resistor between the emitters of transistors 302-304 of the first differential pair of transistors) and to the linearization resistor 310. Furthermore, the emitter of transistor 304 is directly connected to the linearization resistor 310 as well.

Similarly, the emitters of the two transistors 306-308 that make up the second differential pair of transistors are directly connected to the linearization resistor 310. Additionally, the emitters of the two transistors 306-308 that make up the second differential pair of transistors are directly connected to one another. In other words, the emitter of transistor 306 is directly connected to the emitter of transistor 308 (i.e., there is a direct connection without any resistor between the emitters of transistors 306-308 of the second differential pair of transistors) and to the linearization resistor 310. Furthermore, the emitter of transistor 308 is directly connected to the linearization resistor 310 as well.

The voltage-to-current converter 108 may also include transistors 312-318. In some embodiments, the transistors 312 and 318 are NPN BJTs while transistors 314 and 316 are PNP BJTs. The linearization resistor 310 may also be a part of a translinear loop that also includes the resistors 332-338. For instance, the resistor 334 is connected to the base of transistor 302 and to the emitter of transistor 314. The resistor 336 is connected to the base of transistor 304 and the emitter of transistor 316. The resistor 332 is connected to the base of transistor 306 and the emitter of transistor 312. The resistor 338 is connected to the base of transistor 308 and the emitter of transistor 318. The resistors 332-338 may be configured (i.e., scaled) such that the quiescent current remains the same as in a conventional voltage-to-current converter utilizing the translinear relationship. The base of transistors 312 and 314 may receive voltage input signal 322. The base of transistors 316 and 318 may receive the voltage input signal 324. The voltage input signals 322 and 324 may comprise the differential voltage input signal 122 from FIG. 1. More particularly, the voltage input signal 322 may be a negative voltage input signal ($V_{INn}$) while the voltage input signal 324 may be a positive voltage input signal ($V_{INp}$). The collector of transistors 312 and 318 may be directly connected to the collector power supply line voltage $V_{CC}$ and the collectors of transistors 314 and 316 may be directly connected to the emitter power supply line voltage $V_{EE}$. The collectors of transistors 302-308 may generate, and thus are directly connected to, the current output signal 126. More particularly, the collectors of transistors 304 and 308 are connected to a negative current output signal ($I_{OUTn}$) while the collectors of transistors 302-306 are connected to a positive current output signal ($I_{OUTp}$).

This configuration creates less (i.e., better) total harmonic distortion in the voltage-to-current converter 108 than in conventional voltage-to-current converters. For example, in the configuration of voltage-to-current converter 108, for small signals, $I_{OUTp}-I_{OUTn}=GM \times (V_{INn}-V_{INp})$ and for large signals, $$I_{OUTp} - I_{OUTn} \approx \frac{1}{R_{310}} \times (V_{INn} - V_{INp})$$

where GM is the transconductance and $R_{310}$ is the resistance of the linearization resistor 310. Thus, for both large and small signals GM is independent of $R_{310}$. Thus, GM and $R_{310}$ may be independently configured (i.e., set) to improve overall linearity of the relationship between the voltage input signal 122 and the current output signal 126 and, thus, reduce the total harmonic distortion of the voltage-to-current converter 108. Furthermore, power consumption is significantly decreased due to the voltage drop across the resistors 332-338 in the translinear loop.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A voltage-to-current converter, comprising:
   a first differential pair of transistors including a first transistor and a second transistor, an emitter of the first transistor directly connected to an emitter of the second transistor;
   a second differential pair of transistors including a third transistor and a fourth transistor, an emitter of the third transistor directly connected to an emitter of the fourth transistor;
   a first resistor connected to the emitter of the first transistor, the emitter of the second transistor, the emitter of the third transistor, and the emitter of the fourth transistor;
   a fifth transistor comprising an emitter directly connected to a base of the first transistor;
   a sixth transistor comprising an emitter directly connected to a base of the second transistor,
   a seventh transistor comprising an emitter directly connected to a base of the third transistor;
   an eighth transistor comprising an emitter directly connected to a base of the fourth transistor;
   a second resistor directly connected to the base of the first transistor and the emitter of the fifth transistor;
   a third resistor directly connected to the base of the second transistor and the emitter of the sixth transistor;
   a fourth resistor directly connected to the base of the third transistor and the emitter of the seventh transistor; and
   a fifth resistor directly connected to the base of the fourth transistor and the emitter of the eighth transistor.

2. The voltage-to-current converter of claim 1, wherein:
   a base of the fifth transistor and a base of the seventh transistor are configured to receive a first voltage input signal; and
   a base of sixth transistor and a base of the eighth transistor are configured to receive a second voltage input signal.

3. The voltage-to-current converter of claim 2, wherein the first and second voltage input signals are a differential pair of signals.

4. The voltage-to-current converter of claim 1, wherein a collector of the second transistor is directly connected to a first current output signal and a collector of the fourth transistor is directly connected to a second current output signal.

5. The voltage-to-current converter of claim 4, wherein the first and second current output signals are a differential pair of signals.

6. An operational amplifier, comprising:
   a stage circuit including a voltage-to-current converter configured to receive a differential voltage input signal and generate a current output signal, the input stage circuit including a first differential pair of transistors that includes a first transistor and a second transistor, a second differential pair of transistors that includes a third transistor and a fourth transistor, a fifth transistor, a sixth transistor, a seventh transistor, and an eighth transistor, and a linearization resistor;
   an output stage circuit configured to generate a gained current output signal;
   wherein an emitter of the first transistor is directly connected to an emitter of the second transistor, an emitter of the third transistor directly connected to an emitter of the fourth transistor, and the linearization resistor is connected to the emitter of the first transistor, the emitter of the second transistor, the emitter of the third transistor, and the emitter of the fourth transistor, and
   an emitter of the fifth transistor being directly connected to a base of the first transistor, an emitter of the sixth transistor being directly connected to a base of the second transistor, an emitter of the seventh transistor being directly connected to a base of the third transistor, and an emitter of the eighth transistor being directly connected to a base of the fourth transistor;
   a first resistor directly connected to the base of the first transistor and the emitter of the fifth transistor;
   a second resistor directly connected to the base of the second transistor and the emitter of the sixth transistor;
   a third resistor directly connected to the base of the third transistor and the emitter of the seventh transistor; and
   a fourth resistor directly connected to the base of the fourth transistor and the emitter of the eighth transistor.

7. The operational amplifier of claim 6, wherein:
   a base of the fifth transistor and a base of the seventh transistor are configured to receive a first voltage input signal; and
   a base of sixth transistor and a base of the eighth transistor are configured to receive a second voltage input signal.

8. The operational amplifier of claim 7, wherein a collector of the second transistor is directly connected to a first current output signal and a collector of the fourth transistor is directly connected to a second current output signal.

9. The operational amplifier of claim 8, wherein the first and second voltage input signals are a differential pair of signals and the first and second current output signals are a differential pair of signals.

10. The operational amplifier of claim 6, wherein the voltage-to-current converter is a BJT Class AB transconductance amplifier.

11. A voltage-to-current converter, comprising:
    a first differential pair of transistors comprising a first transistor and a second transistor;
    a second differential pair of transistors comprising a third transistor and a fourth transistor;
    a fifth transistor;
    a sixth transistor;
    a seventh transistor;
    an eighth transistor; and
    a linearization resistor;
    emitters of the first and second transistors being directly connected to each other and to the linearization resistor, and emitters of the third and fourth transistors being directly connected to each other and to the linearization resistor, and an emitter of the fifth transistor being directly connected to a base of the first transistor, an emitter of the sixth transistor being directly connected to a base of the second transistor, an emitter of the seventh transistor being directly connected to a base of the third transistor, and an emitter of the eighth transistor being directly connected to a base of the fourth transistor, further comprising:

a first resistor directly connected to the base of the first transistor and the emitter of the fifth transistor;

a second resistor directly connected to the base of the second transistor and the emitter of the sixth transistor;

a third resistor directly connected to the base of the third transistor and the emitter of the seventh transistor; and a fourth resistor directly connected to the base of the fourth transistor and the emitter of the eighth transistor.

12. The voltage-to-current converter of claim 11, wherein:

a base of the fifth transistor and a base of the seventh transistor are configured to receive a first voltage input signal; and a base of sixth transistor and a base of the eighth transistor are configured to receive a second voltage input signal.

13. The voltage-to-current converter of claim 11, wherein a collector of a first transistor of the first differential pair of transistors is directly connected to a first current output signal and a collector of a second transistor of the second differential pair of transistors is directly connected to a second current output signal.

14. The voltage-to-current converter of claim 1, wherein a transconductance of the voltage-to-current converter is inversely proportional to a value of the first resistor.

* * * * *